US006288938B1

(12) United States Patent
Park et al.

(10) Patent No.: US 6,288,938 B1
(45) Date of Patent: Sep. 11, 2001

(54) FLASH MEMORY ARCHITECTURE AND METHOD OF OPERATION

(75) Inventors: Eungjoon Park, Fremont; Ali Pourkeramati, Redwood City, both of CA (US)

(73) Assignee: Azalea Microelectronics Corporation, Santa Clara, CA (US)

( * ) Notice: Subject to any disclaimer, the term of this patent is extended or adjusted under 35 U.S.C. 154(b) by 0 days.

(21) Appl. No.: 09/433,245

(22) Filed: Nov. 3, 1999

Related U.S. Application Data

(60) Provisional application No. 60/149,767, filed on Aug. 19, 1999.

(51) Int. Cl.[7] .................................................. G11C 14/00
(52) U.S. Cl. ............................. 365/185.08; 365/185.3; 365/189.05; 365/230.08
(58) Field of Search ........................... 365/185.08, 185.3, 365/189.05, 230.08

(56) References Cited

U.S. PATENT DOCUMENTS

| | | | |
|---|---|---|---|
| 4,698,787 | 10/1987 | Mukherjee et al. | 365/185 |
| 4,758,986 | 7/1988 | Kuo | 365/185 |
| 4,884,239 | 11/1989 | Ono et al. | 365/185 |
| 4,996,571 | 2/1991 | Kume et al. | 357/23.5 |
| 5,077,691 | 12/1991 | Haddad et al. | 365/218 |
| 5,172,338 | 12/1992 | Mehrotra et al. | 365/185 |
| 5,357,465 | 10/1994 | Challa | 365/185 |
| 5,475,634 | * 12/1995 | Wang et al. | 365/185.17 |
| 5,541,879 | * 7/1996 | Suh et al. | 365/185.22 |
| 5,553,026 | * 9/1996 | Nakai et al. | 365/201 |
| 5,638,327 | 6/1997 | Dallabora et al. | 365/185 |
| 5,694,358 | * 12/1997 | Kawahara et al. | 365/185.08 |
| 5,747,849 | 5/1998 | Kuroda et al. | 257/321 |
| 5,793,673 | 8/1998 | Pio et al. | 365/185.01 |
| 5,796,657 | 8/1998 | Lee et al. | 365/185.11 |
| 5,850,092 | 12/1998 | Cappelletti | 257/321 |
| 5,912,844 | 6/1999 | Chen et al. | 365/185.28 |
| 5,920,503 | 7/1999 | Lee et al. | 365/185.11 |
| 5,945,717 | 8/1999 | Chevallier | 257/390 |
| 5,949,718 | 9/1999 | Randolph et al. | 365/185.33 |
| 5,953,255 | 9/1999 | Lee | 365/185.29 |

FOREIGN PATENT DOCUMENTS 10-241381   9/1998   (JP).

OTHER PUBLICATIONS

Sameer Haddad et al., "Degradations Due to Hole Trapping in Flash Memory Cells" IEEE Electron Device Letter, vol. 10, No. 3, Mar. 1989, pp. 117–119.
Jonghan Kim et al., "A Novel 4.6F$^2$ NOR Cell Technology With Lightly Doped Source (LDS) Junction for High Density Flash Memories" IEEE 1998, pp. 979–982.
J.D. Bude et al., "EEPROM/Flash Sub 3.0V Drain–Source Bias Hot Carrier Writing" IEDM 1995, pp. 989–991.
Mitsumasa Koyanagi et al., "Optimum Design of n$^+$–n$^-$ Double–Diffused Draing MOSFET to Reduce Hot–Carrier Emission" IEEE Transactions on Electron Devices, vol. Ed–32, No. 3, Mar. 1985, pp. 562–570.
Hitoshi Kume et al., "A 1.28$\mu$m$^2$ Contactless Memory Cell Technology for a 3V–Only 64Mbit EEPROM" IEDM 1992, pp. 991–993.

* cited by examiner

Primary Examiner—Richard Elms
Assistant Examiner—Tuan T. Nguyen
(74) Attorney, Agent, or Firm—Townsend and Townsend and Crew LLP

(57) ABSTRACT

A flash memory device and its method of operation provide for selective, e.g., bit-by-bit, erase operation resulting in much narrower distribution for erase threshold voltage VTE. Latches that couple to the array are set or reset depending on cell content during erase verify. The output of the latches are then applied to selected cells to perform erase. The flash architecture allows for bit-by-bit erase verify operation resulting in a tighter VTE distribution and elimination of the need for preprogramming. In a preferred embodiment, the flash cell is programmed by CHE tunneling and erased by FN tunneling both occurring on the same side (e.g., drain side) of the cell transistor.

20 Claims, 8 Drawing Sheets

FLASH MEMORY ARCHITECTURE AND METHOD OF OPERATION

CROSS-REFERENCE TO RELATED APPLICATIONS

This application derives priority from Application No. 60/149,767, filed Aug. 19, 1999.

BACKGROUND OF THE INVENTION

The present invention relates in general to semiconductor memories and in particular to a novel flash memory array architecture and methods of operation of the same.

FIG. 1 is a simplified diagram of a conventional flash memory array. The array includes a matrix of flash memory cells 100 connected as shown to a group of bit lines BL0-BLM, a group of word lines WL0-WLN, and a common or global source line GSL that receives source voltage VSS. The most common variety of flash memories today employs channel hot electron (CHE) for programming and negative gated Fowler-Nordhiem (FN) tunneling for erase. The CHE programming normally programs 1, 2, 4, 8 or 16 cells at a time and involves multiple program and program verify steps. During the programming sequence voltages are applied to the various terminals of each cell until the cell threshold voltage VT rises above the minimum programming threshold voltage VTPmin. A typical condition for CHE programming of cell 00 is, e.g., word line 0 (WL0)= 10volts, bit line 0 (BL0)=5 volts, WLI-N=0 volts, BL1-M=0 volts. This type of CHE programming can result in a well-controlled and narrow VTP distribution across the array.

Negative gated FN tunneling erase uses multiple erase and erase verify steps to ensure that the threshold voltage for all cells is less than the maximum erase threshold voltage (i.e., VT<VTEmax). As shown in FIG. 1, conventional flash memory arrays use a global source line GSL that connects to the source terminal of all cells within an array. Thus, during erase, all cells with a common source line are erased at the same time. This is commonly referred to as bulk erase or sector erase. A typical erase condition is, e.g., WL0-N=− 10 volts, BL0-M=Float, and GSL (VSS)=4 volts. The negative gated FN tunneling erase in conventional flash memories suffers from a number of drawbacks. To ensure that the slowest cell in the array is fully erased, the erase operation normally involves multiple erase steps. In the case of those cells that are already erased prior to the start of another erase operation, a new erase cycle may cause the cell to be depleted, lowering the threshold voltage into the negative range. This effect, which is commonly referred to as over-erasure, can result in functional failure. To prevent over-erasure, all the cells in the array to be erased are first programmed before the actual erase operation begins. This is referred to as preprogramming. Preprogramming is a very time consuming process (e.g., 1 µs per cell) and increases the array erase time significantly.

Another problem with this type of bulk erase is poor control over VTE distribution. To increase the cell current and device speed, it is desirable to have a VTEmax that is as low as possible. Even with a preprogramming step, the simultaneous and repeated erasing of all of the cells in the array results in wide distribution of VTE among the cells across the array. A wide VTE distribution, however, places a lower limit on the value of VTEmax since VTEmin must not become negative. FIG. 2 illustrates a typical distribution for VTE and VTP for a conventional FN-erase/CHE-program type flash memory. In this example, VTEmin is set at zero and VTEmax at 2 volts. There is a two volt sensing margin and a 1 volt data retention margin, placing VTPmin at 5 volts. With a 2 volt wide VTE distribution, targeting a lower VTEmax would result in negative VTEmin which would be unacceptable.

There is therefore a need for a flash memory device that does not suffer from the problems associated with over-erasure and wide VTE distribution.

SUMMARY OF THE INVENTION

The present invention provides a flash memory device that can be selectively erased, for example, on a bit-by-bit or page-by-page basis. Broadly, the flash memory according to the present invention includes latches that can be set or reset depending on cell content during erase verify. The flash architecture allows for bit-by-bit erase verify operation resulting in a tighter VTE distribution and elimination of the need for preprogramming. In one embodiment, a latch is connected to each bit line and includes a set/reset input that is controlled by a signal from the read sense amplifier output.

In a specific embodiment, instead of having a global source line, the flash memory according to the present invention divides the source line into multiple independent segments to reduce the potential leakage current that may otherwise result in read failure. More specifically, the source lines are divided by word line wherein, for example, one source line is shared by N adjacent word lines, where N (e.g., N=2) is determined based on process and application requirements. This reduces the number of memory cells attached to a bit line such that during read fewer potentially depleted cells would be attached to the bit line. In yet another embodiment, latches are placed on word lines instead of bit lines to allow for column erase with reduced bias voltage requirements. In a preferred embodiment, the flash memory cell according to the present invention is programmed by channel hot electron (CHE) tunneling and erased by FN tunneling, both occurring at the same (e.g., drain) junction.

Accordingly, in one embodiment, the present invention provides a flash memory device including: a plurality of memory cells arranged in a two-dimensional array of rows and columns; a plurality of latches respectively coupled to the columns of memory cells; a decoder coupled to the columns; and a sense amplifier having an input coupled to the decoder and an output coupled to a set/reset input of the plurality of latches, wherein the plurality of latches are selectively set or reset depending on the content of a selected cell. In an alternate embodiment, the plurality of latches couple to the rows.

In another embodiment, the present invention provides a method for erasing a flash memory device including the steps of: (a) selecting a memory cell to be erased; (b) reading cell current for the selected cell to determine a level of threshold voltage for the cell; (c) setting or resetting a state of a latch coupled to the selected memory cell depending on the level of the threshold voltage; and (d) erasing the selected memory cell by applying the state of the latch to the selected memory cell.

In yet another embodiment, the present invention provides a flash memory device including: a plurality of memory cells each having a gate terminal, a source terminal and a drain terminal, the memory cells being arranged in a plurality of rows and columns, wherein gate terminals of memory cells in each row couple to a respective word line, drain terminals of memory cells in each column couple to a respective bit line, and source terminals of the plurality of memory cells couple to a plurality of electrically separate source lines. In a specific embodiment, one of the plurality of electrically separate source lines couples to source terminals of memory cells in two adjacent rows.

In a further embodiment, the present invention provides a flash memory cell having a gate terminal, a source terminal coupled to a source region and a drain terminal coupled to a drain region, wherein programming of the cell occurs by biasing the memory cell to induce channel hot electron tunneling at one of the source or drain junctions, and erasing occurs by biasing the memory cell to induce FN tunneling at the same one of source or drain junctions where programming occurs.

The following detailed description and the accompanying drawings provide a better understanding of the nature and advantages of the flash memory device and its method of operation according to the present invention.

DESCRIPTION OF THE SPECIFIC EMBODIMENTS

Figure 3:
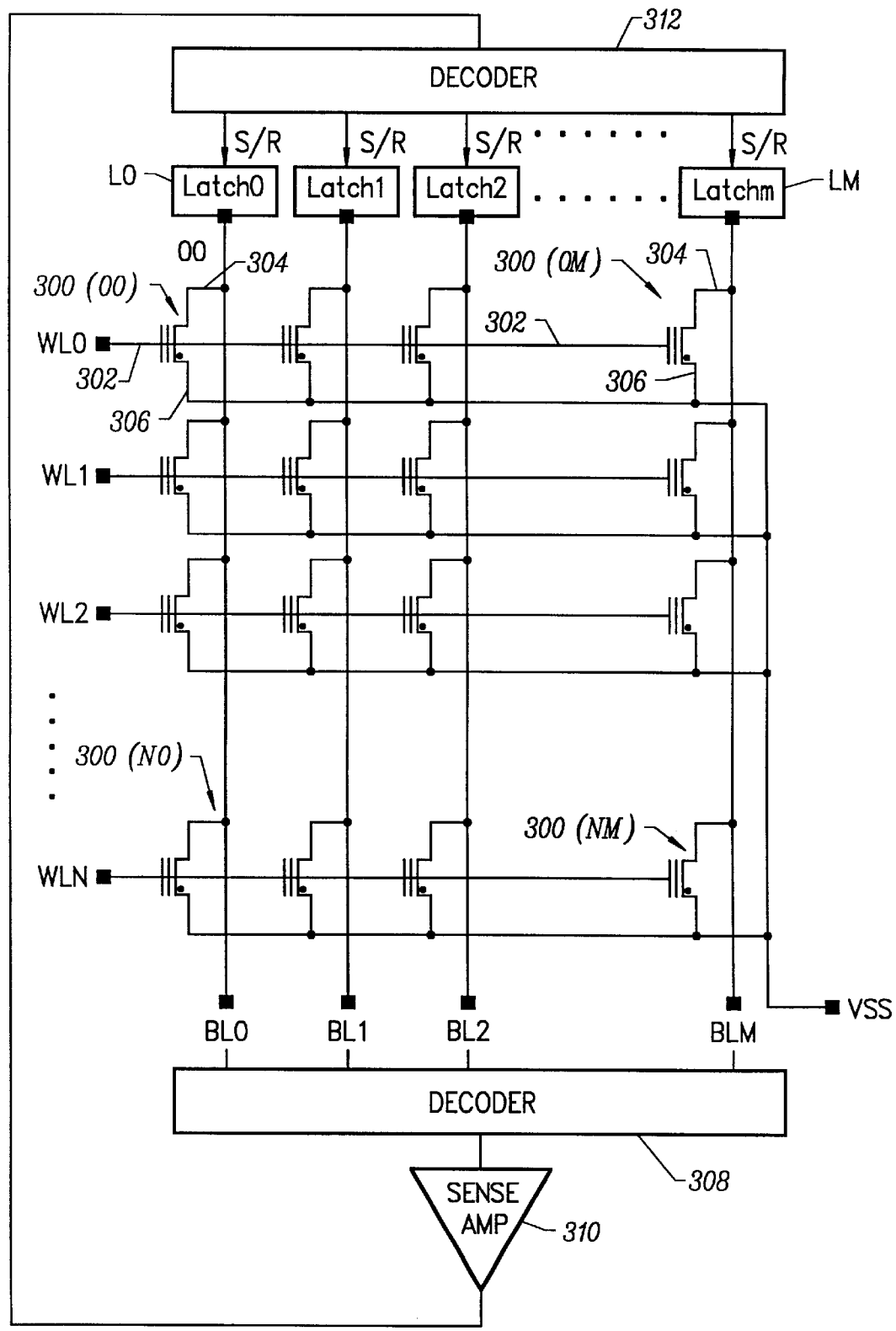
FIG. 3 is a simplified block diagram showing a flash memory cell array according to one embodiment of the present invention.

Referring to FIG. 3, there is shown a simplified diagram of an array of flash memory cells 300 arranged according to one embodiment of the present invention. Each memory cell 300 is preferably made up of a single transistor of double-poly stacked gate type, with a gate terminal 302 connected to a word line (WLi), a drain terminal 304 connected to a bit line (BLi), and a source terminal 306 connected to a source voltage VSS. In this embodiment, the source line VSS is a global source line connecting to the source terminals of all the cells within the array. The array includes N+1 rows or WLs (WL0-WLN) and M+1 columns or BLs (BL0-BLM). A column decoder 308 receives BL0-BLM at its inputs and selects the signal on one BLi to be supplied to a sense amplifier 310. The output of sense amplifier 310 is fed back to a bank of set/reset latches L0 through LM through a decoder 312. Decoder 312 selectively applies the signal at the output of sense amplifier 310 to the set/reset input of a selected latch Li. Decoders 308 and 312 operate in response to the column address that is supplied to the decoders (not shown). The output of latches L0-LM connect respectively to BL0-BLM.

Figure 4:
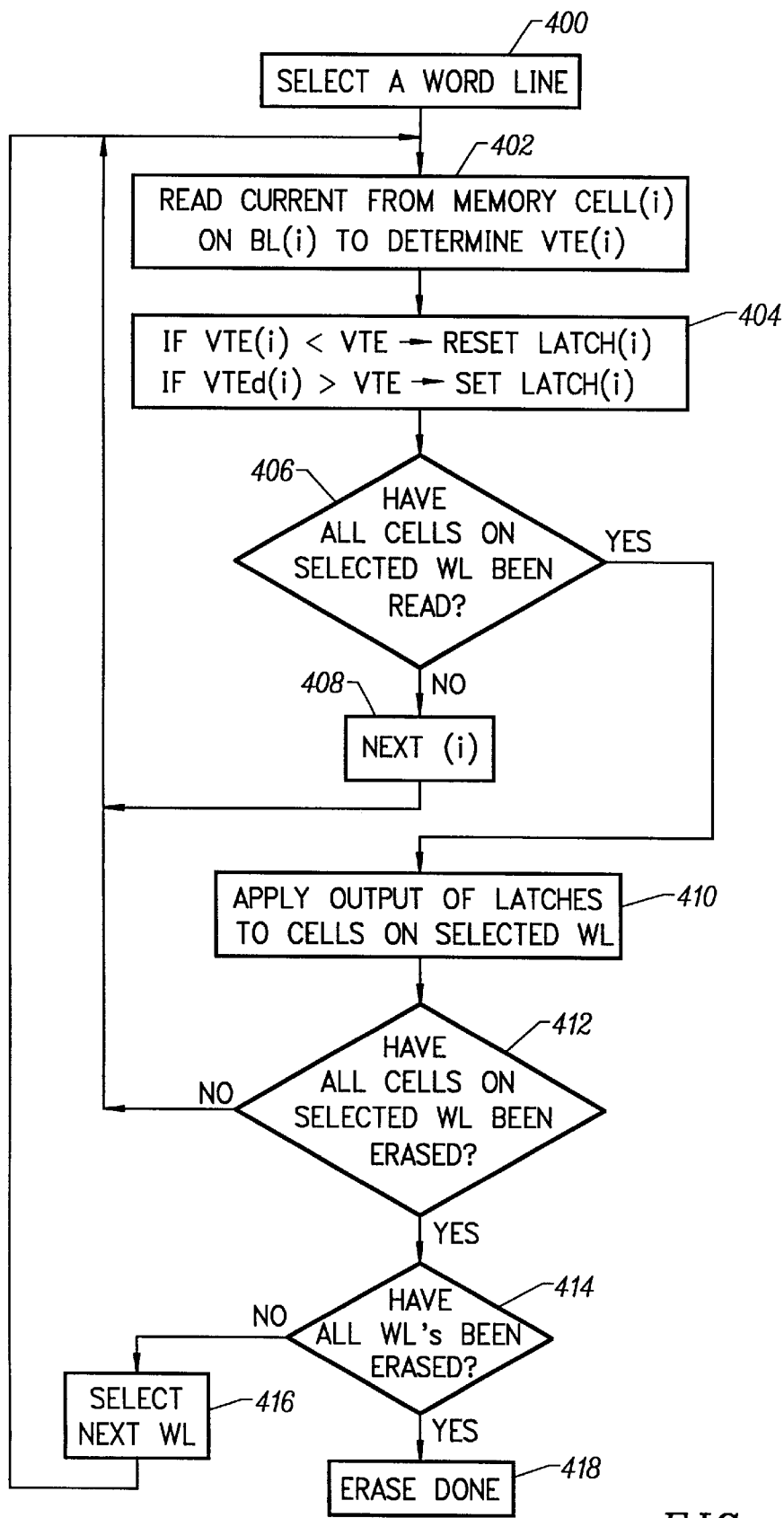
FIG. 4 is a flow diagram illustrating the erase operation according to the present invention.

The operation of the flash memory according to this embodiment of the present invention will be described hereinafter in connection with FIGS. 3 and 4. An erase operation according to this invention includes a bit-by-bit erase verify step. The erase verify operation is somewhat similar to a read operation and starts by first selecting a word line, e.g., WL0, (step 400) for verifying the erase threshold VTE of all memory cells coupled to that word line. The first bit line BL0 is activated selecting, e.g., memory cell 300 (00). This is accomplished by applying a voltage VH1 to WL0 with WL1 through WLN at ground, applying, e.g., 0.7 v to 1 v to BL0, and ground to the global source line. Sense amplifier 310 then reads the current from the selected cell 00 (step 402). The voltage VH1 is preferably equal to the target erase threshold voltage VTE plus a predetermined margin (i.e., VH1=VTE+$\Delta$V) to verify the actual cell threshold voltage.

In the next step (404), the level of the erase threshold voltage VTE for the selected cell 00 is checked by sense amplifier 310. If VTE(00) is less than the target VTE (e.g.,0.5 volts), then the cell will be treated as an erased cell and its associated latch L0 is reset to low logic level (e.g. ground). However, if VT(00) is greater than the target VTE, then latch L0 is set to high (e.g., 5.5 volts). The level of the high voltage at the output of the latch (in this example 5.5 v), is determined based on the process requirements for the FN tunneling mechanism and may vary from process to process. The sensing of the VTE is repeated bit-by-bit for all cells on the selected word line until all latches are set or reset (steps 406, 408). Once this process is completed, all of the cells on the selected word line are erased by applying the outputs of the latches to the bit lines of their respective cells (step 410). For this erase step, the selection of the word line is accomplished by applying a negative voltage of about, e.g., −10 volts to the selected WL. Erase occurs by FN tunneling through the gate-drain overlap region on the drain side of each cell. This may be repeated (step 412) for the same word line to make sure all cells have been properly erased. This process continues for the next word line until all word lines within the array have been erased (steps 414, 416 and 418).

Figure 1:
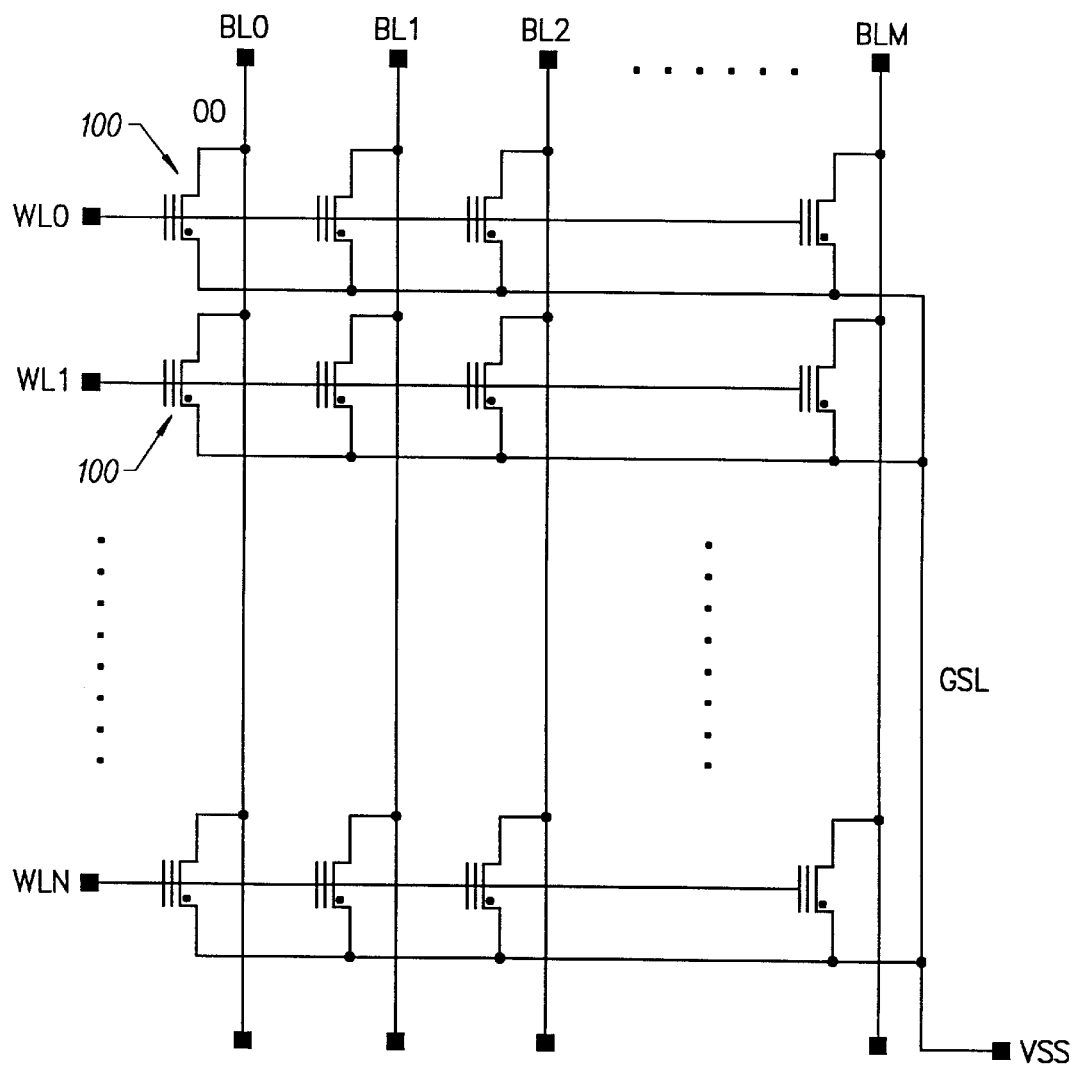
FIG. 1 shows a conventional flash memory cell array.
Figure 2:
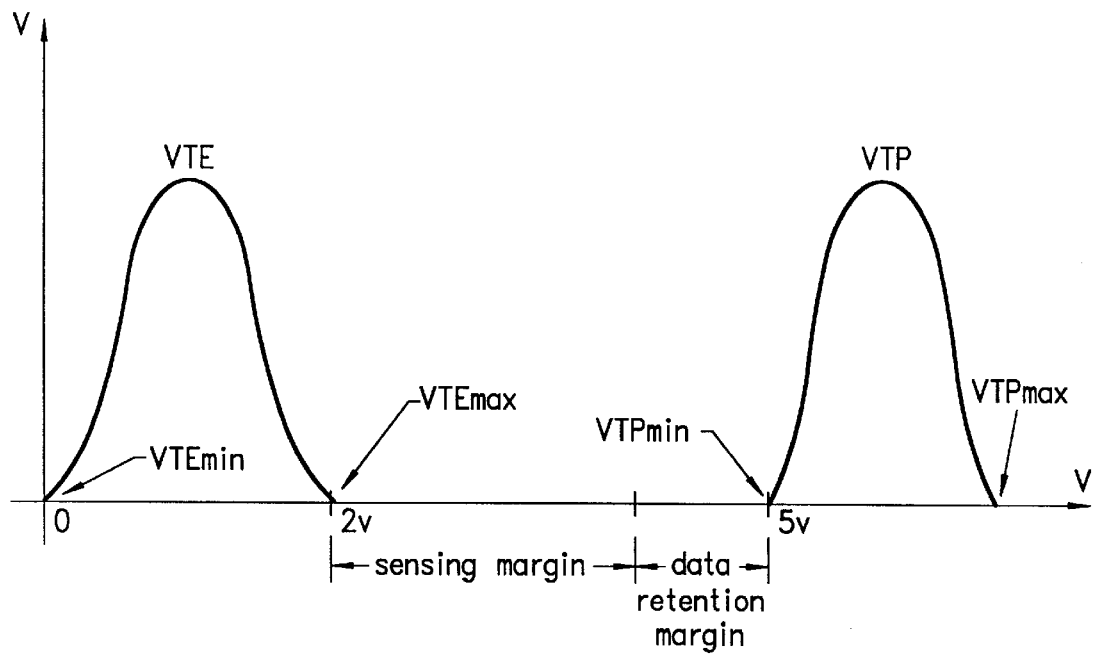
FIG. 2 illustrates a typical distribution for VTE and VTP for a conventional FN-erase/CHE-program type flash memory.
Figure 5:
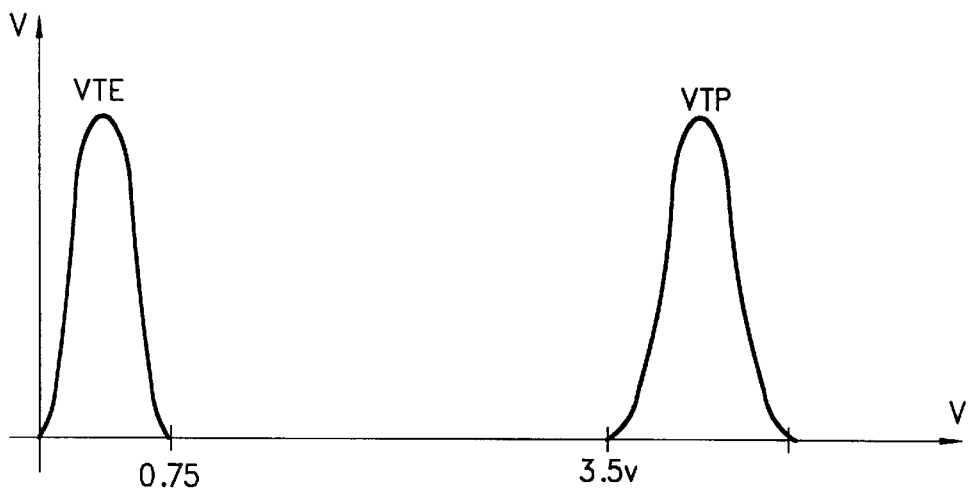
FIG. 5 illustrates the VTE and VTP distributions for a FN-erase/CHE-program type flash memory according to the present invention.

The bit-by-bit (or word by word) erase according to the present invention results in a much narrower VTE distribution, as shown in FIG. 5, eliminating the need for any preprogramming. The narrow distribution also allows the VTEmax value to be reduced to, for example, 1 volt which maximizes cell current.

In a preferred embodiment, the flash memory device according to the present invention is erased using FN tunneling as described above, and it is programmed by channel hot electron (CHE) mechanism. An exemplary bias condition for programming cell 00 brings WL0 up to, e.g., 10 volts while WL1-WLN are kept at ground, BL0 receives a high voltage such as 5.5 volts to trigger CHE, while BL1-BLM are kept at ground, and the source line is grounded. Under this biasing condition, channel hot electron tunneling occurs at the pinch-off region on the drain side of each cell. As described above, an exemplary bias condition for erasing cell 00 brings WL0 to, e.g., −10 volts while WL1-WLN are kept at ground, BL0 receives, e.g., about 5.5 volts (output of latch) while BL1-BLM are kept at ground, and the source line is left unconnected and floating. Under this biasing condition, FN tunneling occurs through the gate-drain overlap region. Thus, according to this embodiment of the present invention, both programming and erase occur through the same junction, in this example, the drain side. It is to be understood, however, that same-side erase and programming according to the present invention, can also occur on the source side of the cell.

Figure 6:
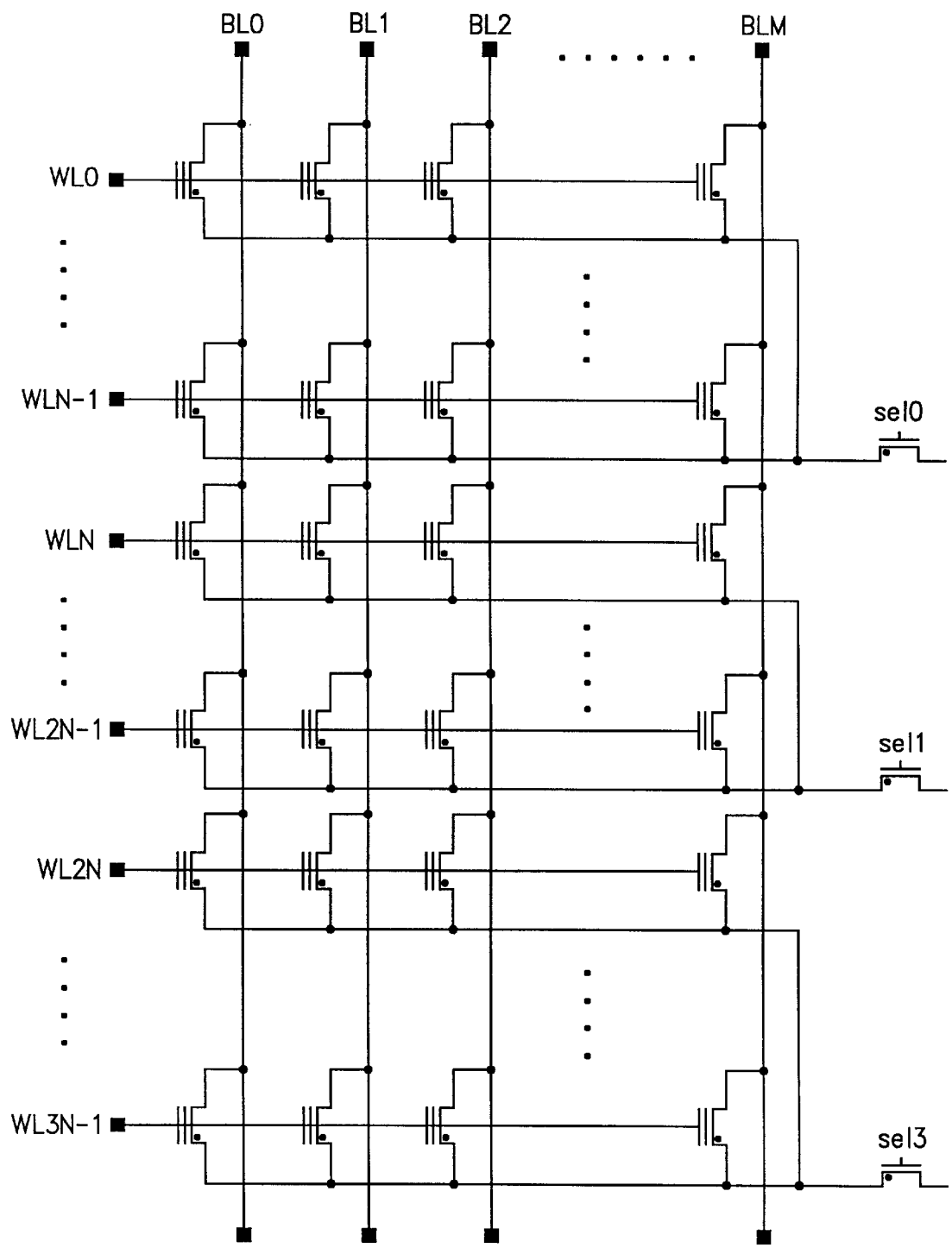
FIG. 6 is a simplified diagram of a flash memory cell array with decoded source lines according to the present invention.
Figure 8:
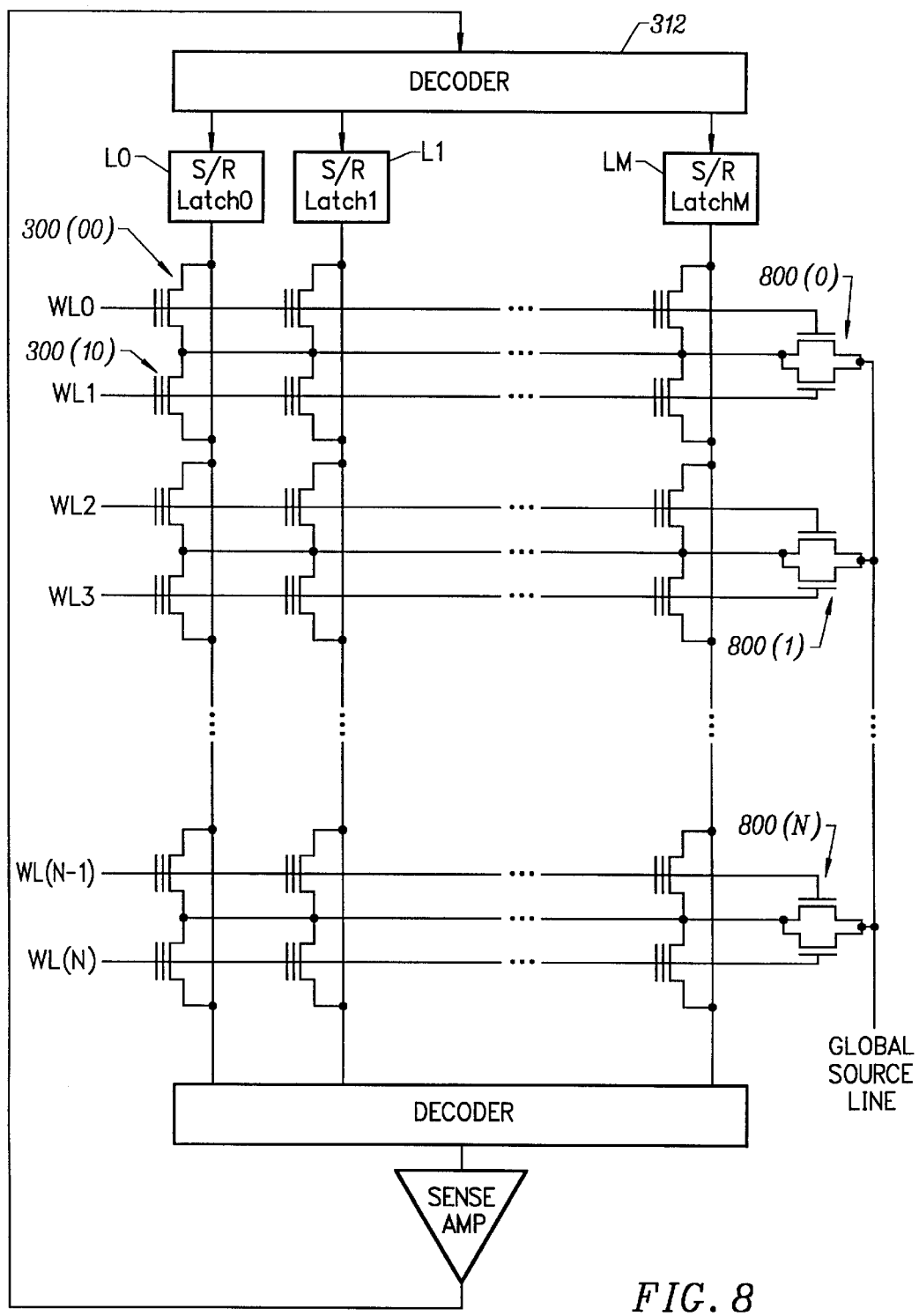
FIG. 8 provides a more complete diagram for the embodiment with decoded source lines including the latch structure and segmented source lines.

FIG. 3 shows an embodiment wherein a global source line is used. A potential problem with a global source line scheme is faulty sensing of programmed cells due to leakage. In an alternate embodiment, the present invention addresses this potential problem by dividing the source line into multiple independent segments each shared by N word lines. An exemplary implementation for this embodiment is shown in FIG. 6 where two adjacent word lines share a dedicated source line (i.e., N=2). The number of word lines N that share a source line can vary depending on process and circuit application requirements. Each source line is selected when an associated word line is selected for sensing purposes during read or erase verify operations. That is, the same decoder that selects a word line WLi during read or erase verify, selects a source line SELi. The general methodology for read/write and erase/program operations for this architecture may be the same as described above in connection with FIGS. 3 and 4. In the exemplary embodiment, erasing is accomplished one row at a time with the ability to select bit-by-bit. FIG. 8 provides a more complete diagram for this exemplary embodiment including the latch structure and segmented source lines. In the embodiment shown in FIG. 8, a pair of transfer gates 800(i) decode the shared source line for a pair of adjacent rows. The global source line can be either coupled to ground or to another voltage depending on the operational requirements.

Figure 9:
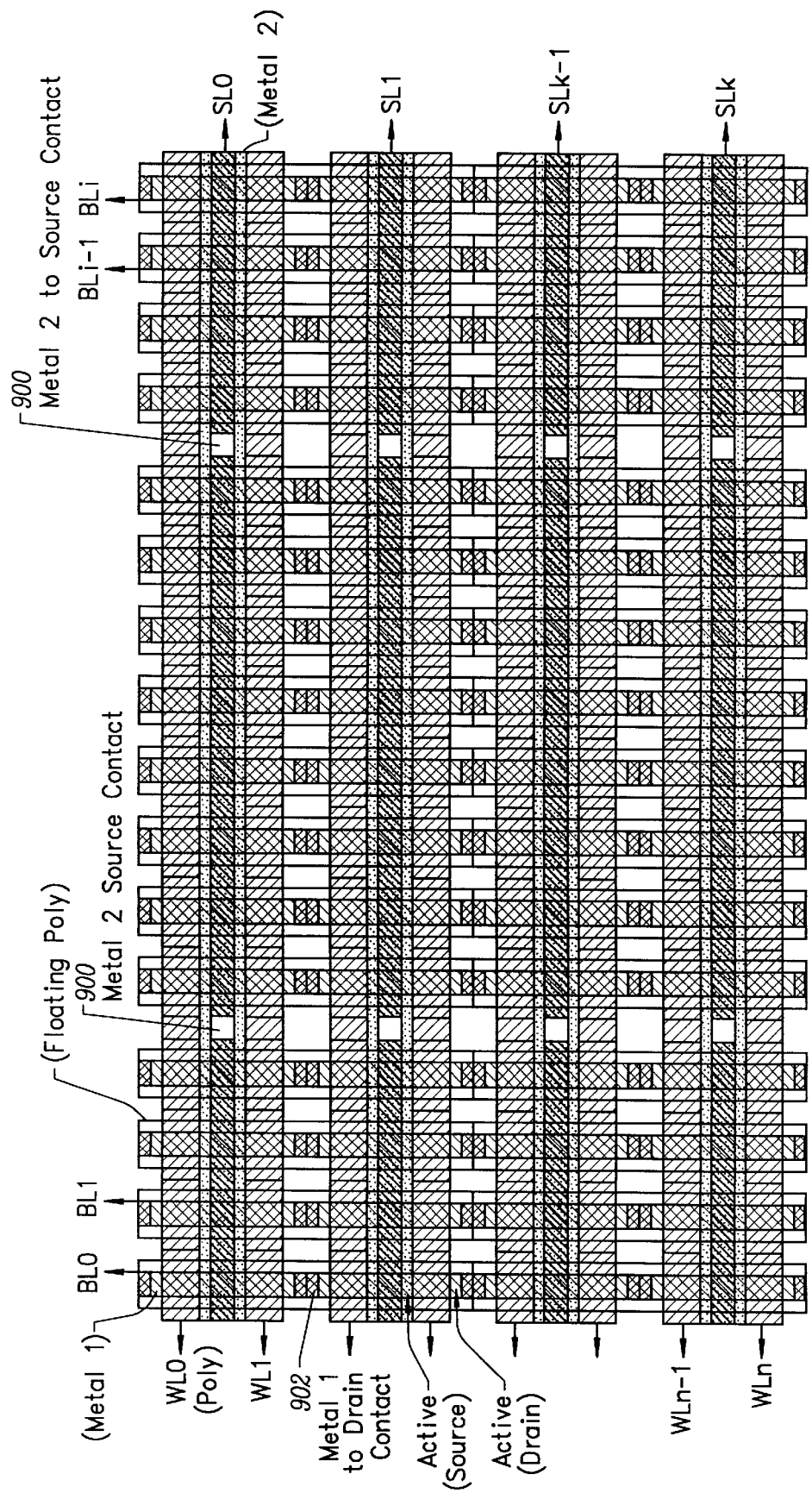
FIG. 9 shows an exemplary layout architecture depicting part of the array.

An added advantage to dividing the source line according to this invention is in the compactness of the array layout. FIG. 9 shows an exemplary layout architecture depicting part of the array. Cells in adjacent rows that share a common source line SL(i) are laid out such that their source nodes are adjacent to each other allowing the sharing of the source diffusion regions. Accordingly, the common source line for each pair of adjacent rows is formed of a single source diffusion layer extending in parallel with the word line. This eliminates the need for a source contact at each cell and results in a smaller cell and overall array size as compared to an architecture where source lines are divided per bit line. In the exemplary embodiment shown, there is one contact 900 every eight bit lines connecting the common source region between a pair of poly word lines to metal 2 layer. Contacts 902 to the drain regions (bit lines) are made on either sides of a pair of word lines to metal 1 layer.

Table 1 below summarizes exemplary biasing conditions for the various modes of operation of a flash memory device according to the present invention:

| Mode | Selected WL | Un-selected WL | Selected BL | Un-selected BL | Selected SL | Un-selected SL |
| --- | --- | --- | --- | --- | --- | --- |
| Erase | −10 V | 0 | 5.5 V | Float | Float | Float |
| Erase VF | VH1 | 0 | 0.7 V | Float | Vss | Float |
| Program | 10 V | 0 | 5.5 V | Float | Vss | Float |
| Program VF | VH2 | 0 | 0.7 V | Float | Vss | Float |
| Read | Vcc | 0 | 0.7 V | Float | Vss | Float |

The voltage VH2 is preferably equal to the target program threshold voltage VTP minus a predetermined margin (i.e., VH2=VTP−ΔV) to verify the actual cell threshold voltage.

Figure 7:
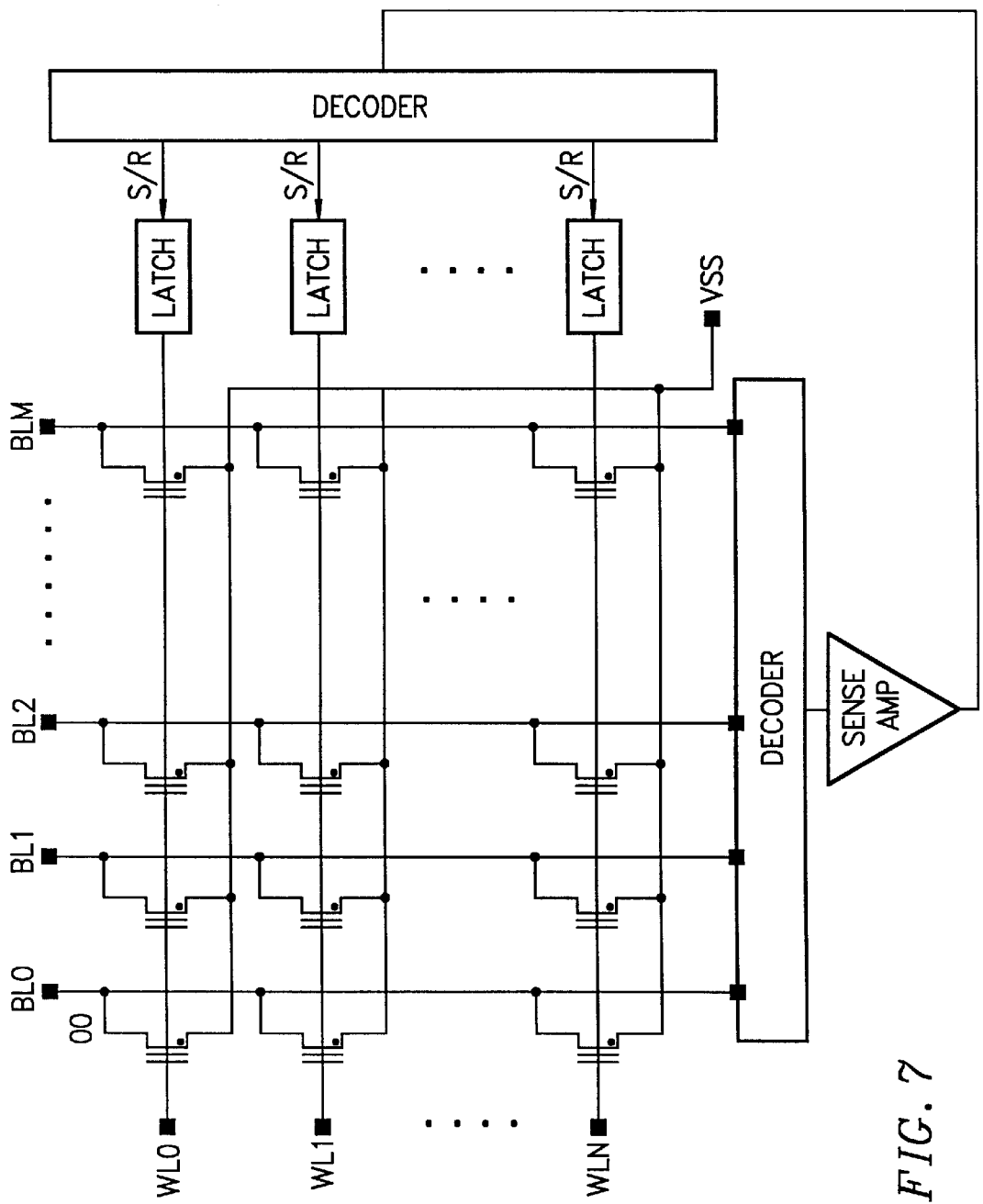
FIG. 7 is a simplified diagram of an alternate embodiment for a flash memory cell array according to the present invention.

In yet another embodiment the present invention couples the latches to the word lines as shown in FIG. 7. In this embodiment, because erase is done one column at a time as opposed to an entire row at a time, biasing voltages with smaller magnitudes can be used. Otherwise the general operation of the flash memory according to this embodiment is similar to that shown in FIG. 3 with similar advantages.

In conclusion, the present invention provides method and circuitry for manufacturing and operating a flash memory device that provide a number of performance advantages. A novel architecture allows for bit-by-bit (or word-by-word) erase resulting in tighter VTE distribution. A segmented source line architecture reduces the potential leakage current that may otherwise result in read failure. The cell is programmed by CHE tunneling and erased by FN tunneling both occurring at the same junction. While the above is a complete description of the preferred embodiment of the present invention, it is possible to use various alternatives, modifications and equivalents. For example, all voltage levels indicated for various biasing conditions are used herein for illustrative purposes only, and that they may vary depending on the process and circuit requirements. Further, the circuit diagrams are for depiction of the various circuit elements and do not necessarily limit the layout or other architectural aspects of the array. For example, cells in adjacent rows in FIG. 6 that share a common source line may be physically laid out as mirror images such that the source terminals of adjacent cells from two adjacent rows are physically adjacent to each other. Therefore, the scope of the present invention should be determined not with reference to the above description but should, instead, be determined with reference to the appended claims, along with their full scope of equivalents.

What is claimed is:

1. A flash memory device comprising:
    a plurality of memory cells arranged in a two-dimensional array of rows and columns;
    a plurality of latches respectively coupled to the plurality of columns of memory cells;
    a first decoder coupled to the plurality of columns;
    a sense amplifier having an input coupled to the first decoder and an output; and
    a second decoder having an input coupled to the output of the sense amplifier and a plurality of outputs respectively coupled to a plurality of set/reset inputs of the plurality of latches,
    wherein, each of the plurality of latches is selectively set or reset depending on the content of a selected cell.

2. The flash memory device of claim 1 wherein the two-dimensional array comprises N rows and M columns, where N and M are integers,
    each row including M memory cells, with each cell having a transistor with a gate terminal coupled to a common word line, a source terminal coupled to a common source line, and a drain terminal coupled to a respective one of M bit lines.

3. The flash memory device of claim 2 wherein the drain terminal of each of the M memory cells in each row couples to an output of a respective one of the plurality of latches.

4. The flash memory device of claim 3 wherein the first decoder receives the M bit lines at its inputs, and
    wherein, the second decoder generates M outputs coupled to the set/reset inputs of M latches.

5. The flash memory device of claim 2 wherein each cell is erased and programmed through the drain side of the cell transistor.

6. The flash memory device of claim 5 wherein programming of each cell occurs by channel hot electron tunneling and erasing occurs by Fowler-Nordhiem tunneling.

7. The flash memory device of claim 2 wherein the common source line in each row couples to a common global source line, the common global source line coupling to ground via a transistor switch.

8. The flash memory device of claim 2 wherein the common source line in a row couples to the common source line in an adjacent row to form a plurality of subsets of rows having a respective plurality of electrically independent common source lines.

9. The flash memory device of claim 8 wherein the plurality of electrically independent common source lines couple to ground via a respective plurality of transistor switches.

10. The flash memory device of claim 9 wherein the respective plurality of transistor switches is decoded during sensing operation.

11. A method for operating a flash memory device comprising:
   (a) selecting a memory cell;
   (b) reading cell current for the selected cell to determine a level of threshold voltage for the cell;
   (c) setting or resetting a state of a latch coupled to the selected memory cell depending on the level of the threshold voltage; and
   (d) erasing the selected memory cell by applying the state of the latch to the selected memory cell.

12. The method of claim 11 wherein the step of selecting a memory cell comprises selecting a word line and a bit line, and wherein the steps of reading and setting or resetting occur for all cells on the selected word line.

13. The method of claim 12 wherein the step of selecting, reading and setting or resetting occur for all cells in all word lines of an array within the memory device.

14. The method of claim 13 wherein the step of erasing comprises applying a high negative voltage to the selected word line and a positive voltage to the selected bit line.

15. The method of claim 12 further comprising a step of comparing the level of threshold voltage for the cell to a target erase threshold voltage level.

16. The method of claim 11 wherein the step of selecting a word line comprises applying a positive voltage to the word line, and a positive voltage to the bit line.

17. The method of claim 12 wherein the step of setting or resetting comprises setting a state of the latch when the threshold voltage is less than a target erase threshold voltage level and resetting the state of the latch when the threshold voltage is greater than the target erase threshold level.

18. A flash memory device comprising:
   a plurality of memory cells each having a gate terminal, a source terminal and a drain terminal, the memory cells being arranged in a plurality of rows and columns,
   wherein gate terminals of memory cells in each row couple to a respective word line, drain terminals of memory cells in each column couple to a respective bit line, and source terminals of the plurality of memory cells in each row couple to a common source line, and
   wherein common source lines from N adjacent rows of memory cells couple to an electrically independent common source line to form a plurality of electrically independent common source lines; and
   a plurality of source line select transistors respectively coupled to the plurality of electrically independent common source lines, the plurality of source line select transistors being selectively activated during sensing operations.

19. The flash memory device of claim 18 wherein the source terminals of the plurality of memory cells in each of two adjacent rows of cells are connected together to form a shared source diffsion line extending parallel to the rows of cells, wherein each source diffusion line is strapped with a metal line, the metal line forming one of the plurality of electrically independent common source lines.

20. A flash memory device comprising:
   a plurality of memory cells arranged in a two-dimensional array of rows and columns;
   a plurality of latches respectively coupled to the plurality of rows of memory cells;
   a first decoder coupled to the plurality of columns;
   a sense amplifier having an input coupled to the first decoder an output; and
   a second decoder having an input coupled to the output of the sense amplifier and a plurality of outputs respectively coupled to a plurality of set/reset inputs of the plurality of latches,
   wherein, each of the plurality of latches is selectively set or reset depending on the content of a selected cell.

* * * * *